(12) United States Patent
Singh et al.

(10) Patent No.: US 10,608,565 B2
(45) Date of Patent: Mar. 31, 2020

(54) SYSTEMS AND METHODS FOR ROTATING A CRANKSHAFT TO START AN ENGINE

(71) Applicant: GENERAL ELECTRIC COMPANY, Schenectady, NY (US)

(72) Inventors: Yash Veer Singh, Schenectady, NY (US); Ruxi Wang, Cohoes, NY (US); Satish Prabhakaran, Albany, NY (US); Cong Li, Schenectady, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 110 days.

(21) Appl. No.: 15/834,059

(22) Filed: Dec. 7, 2017

(65) Prior Publication Data
US 2019/0181786 A1 Jun. 13, 2019

(51) Int. Cl.
*B60L 11/02* (2006.01)
*H02P 9/30* (2006.01)
(Continued)

(52) U.S. Cl.
CPC ............. *H02P 9/30* (2013.01); *B64D 35/00* (2013.01); *B64D 41/00* (2013.01); *H02P 9/08* (2013.01);
(Continued)

(58) Field of Classification Search
CPC .... H02P 1/26; H02P 1/46; H02P 27/04; H02P 27/08; H02P 27/085
See application file for complete search history.

(56) References Cited

U.S. PATENT DOCUMENTS

| | | | | |
|---|---|---|---|---|
| 3,205,428 A | * | 9/1965 | Kerr et al. | G01P 3/46 307/122 |
| 3,832,625 A | * | 8/1974 | Gyugyi | H02M 5/271 322/20 |

(Continued)

FOREIGN PATENT DOCUMENTS

WO 2015195782 A1 12/2015

OTHER PUBLICATIONS

Mohammed Alnajjar et al., "Six-phase electrically excited synchronous generator for More Electric Aircraft", Symposium, Jun. 22-24, 2016, IEEE International Symposium on Power Electronics, Electrical Drives, Automation and Motion (SPEEDAM).

(Continued)

*Primary Examiner* — Tulsidas C Patel
*Assistant Examiner* — Thomas K Quigley
(74) *Attorney, Agent, or Firm* — Armstrong Teasdale LLP (57) ABSTRACT

An electrical power unit is disclosed. The electrical power unit includes a controller configured to generate a first control signal based on a first operational state of an engine, a multiphase electrical machine including a plurality of three-phase windings; and an electrical power conditioning subunit operatively coupled to the controller, where the electrical power conditioning subunit comprises a plurality of converters, where at least one converter is electrically coupled to a corresponding three-phase winding of the plurality of three-phase windings based on the first control signal, and where the electrical power conditioning subunit is configured to transmit a first electrical power from the at least one converter to the corresponding three-phase winding, where the multiphase electrical machine is configured to generate a mechanical power based on the first electrical power and rotate a crankshaft operatively coupled to the (Continued)

engine based on the generated mechanical power to start the engine.

21 Claims, 7 Drawing Sheets (51) Int. Cl.
  B64D 41/00 (2006.01)
  B64D 35/00 (2006.01)
  H02P 9/08 (2006.01)
  H03H 7/01 (2006.01)
  H02P 101/30 (2015.01)
(52) U.S. Cl.
  CPC ...... B64D 2221/00 (2013.01); H02P 2101/30 (2015.01); H03H 7/0115 (2013.01)

(56) References Cited

U.S. PATENT DOCUMENTS

| | | | | |
|---|---|---|---|---|
| 5,543,703 | A * | 8/1996 | Kusase | H01L 29/7803 322/16 |
| 6,373,163 | B1 * | 4/2002 | Oohashi | H02K 3/12 310/184 |
| 7,605,487 | B2 * | 10/2009 | Barton | H02J 3/1892 290/28 |
| 7,612,514 | B2 | 11/2009 | Anghel et al. | |
| 7,615,892 | B2 | 11/2009 | Anghel et al. | |
| 7,687,928 | B2 * | 3/2010 | Taneja | F01D 15/10 290/31 |
| 8,136,756 | B2 | 3/2012 | Duces et al. | |
| 9,680,344 | B2 * | 6/2017 | Atalla | H02K 11/25 |
| 9,985,566 | B2 * | 5/2018 | Jiang | B66B 1/308 |
| 2004/0211613 | A1 * | 10/2004 | Asao | B60K 6/26 180/291 |
| 2007/0222220 | A1 | 9/2007 | Huang et al. | |
| 2009/0001840 | A1 * | 1/2009 | Wolf | H02K 3/28 310/203 |
| 2009/0302792 | A1 * | 12/2009 | Osada | H02P 29/032 318/400.21 |
| 2010/0038961 | A1 * | 2/2010 | Divito | F02D 25/00 307/9.1 |
| 2010/0141028 | A1 * | 6/2010 | Rozman | H02J 1/12 307/9.1 |
| 2011/0133703 | A1 * | 6/2011 | Rozman | H02P 9/307 322/59 |
| 2012/0206076 | A1 * | 8/2012 | Tanaka | H02M 7/53873 318/400.28 |
| 2013/0194852 | A1 * | 8/2013 | Nakano | H02M 7/53875 363/131 |
| 2015/0137716 | A1 * | 5/2015 | Roesner | H02P 25/22 318/245 |
| 2015/0244296 | A1 | 8/2015 | Edwards | |
| 2016/0114899 | A1 | 4/2016 | Rozman et al. | |
| 2016/0141997 | A1 * | 5/2016 | Duguey | H02P 25/22 318/400.02 |
| 2016/0208709 | A1 | 7/2016 | Huang | |
| 2016/0336834 | A1 * | 11/2016 | Diedrichs | H02K 29/03 |
| 2016/0365821 | A1 * | 12/2016 | Hustedt | H02P 27/085 |
| 2017/0066531 | A1 * | 3/2017 | McAdoo | H02K 7/1815 |

OTHER PUBLICATIONS

Mohammed Alnajjar et al., "Model predictive control of six-phase variable frequency electrically excited starter generator for more electric aircraft", Conference, Jun. 9-12, 2015, IEEE 11th International Conference on Power Electronics and Drive Systems (PEDS).

* cited by examiner

SYSTEMS AND METHODS FOR ROTATING A CRANKSHAFT TO START AN ENGINE

BACKGROUND

Embodiments of the present specification generally relate to a system and method for rotating a crankshaft to start an engine, and more particularly to an electrical system and method for rotating a crankshaft to start an aircraft engine.

Typically, mechanical power is provided to rotate a crankshaft coupled to an aircraft engine to start an aircraft engine. Generally, a pneumatic system is employed to provide the mechanical power to the crankshaft. In particular, the pneumatic system provides high-pressure air to start the aircraft engine. Use of the pneumatic system for starting the aircraft engine disadvantageously entails transporting the pneumatic system to the aircraft. Also, the supply of mechanical power by the pneumatic systems and other mechanical systems suffers from low efficiency.

Recently, use of electrical systems for starting the aircraft engine has been proposed. The electrical system calls for the use of one or more alternating current (AC) electrical machines, which in turn include autotransformers, thereby resulting in a bigger footprint of the electrical system. Also, in certain scenarios, the topology of the electrical system fails to ensure optimal utilization of the AC electrical machines and associated converters, thereby leading to diminished efficiency of the electrical system for providing mechanical power to the aircraft engine.

BRIEF DESCRIPTION

In accordance with aspects of the present specification, an electrical power unit is presented. The electrical power unit includes a controller configured to generate a first control signal based on a first operational state of an engine, a multiphase electrical machine including a plurality of three-phase windings; and an electrical power conditioning subunit operatively coupled to the controller, where the electrical power conditioning subunit comprises a plurality of converters, where at least one converter is electrically coupled to a corresponding three-phase winding of the plurality of three-phase windings based on the first control signal, and where the electrical power conditioning subunit is configured to transmit a first electrical power from the at least one converter of the plurality of converters to the corresponding three-phase winding, where the multiphase electrical machine is configured to generate a mechanical power based on the first electrical power and rotate a crankshaft operatively coupled to the engine based on the generated mechanical power to start the engine.

In accordance with another aspect of the present specification, a method for rotating a crankshaft operatively coupled to an engine to start the engine using an electrical power unit is presented. The electrical power unit comprises a controller, a multiphase electrical machine, and an electrical power conditioning subunit. The method includes generating, using the controller, a first control signal based on a first operational state of the engine. Further, the method includes electrically coupling at least one converter of a plurality of converters in the electrical power conditioning subunit to a corresponding three-phase winding of a plurality of three-phase windings in the multiphase electrical machine based on the first control signal. Furthermore, the method includes transmitting, using the electrical power conditioning subunit, a first electrical power from the at least one converter of the plurality of converters in the electrical power conditioning subunit to the corresponding three-phase winding of the plurality of three-phase windings in the multiphase electrical machine. Moreover, the method includes generating, using the multiphase electrical machine, a mechanical power based on the first electrical power and rotating a crankshaft operatively coupled to the engine based on the generated mechanical power to start the engine.

In accordance with yet another aspect of the present specification, a propulsion system is presented. The propulsion system includes an engine, an electrical power unit coupled to the engine, where the electrical power unit includes a controller configured to generate a first control signal based on a first operational state of the engine, a multiphase electrical machine having a plurality of three-phase windings, and an electrical power conditioning subunit operatively coupled to the controller, where the electrical power conditioning subunit includes a plurality of converters, where at least one converter of the plurality of converters is electrically coupled to a corresponding three-phase winding of the plurality of three-phase windings based on the first control signal, and where the electrical power conditioning subunit is configured to transmit a first electrical power from the at least one converter of the plurality of converters to the corresponding three-phase winding of the plurality of three-phase windings, where the multiphase electrical machine is configured to generate mechanical power based on the first electrical power and rotate a crankshaft operatively coupled to the engine based on the generated mechanical power to start the engine.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Unless defined otherwise, technical and scientific terms used herein have the same meaning as is commonly understood by one of ordinary skill in the art to which this disclosure belongs. The terms "first," "second," and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean one, some, or all of the listed items. The use of "including," "comprising" or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect. Furthermore, the terms "circuit" and "circuitry" and "controller" may include either a single component or a plurality of components, which are either active and/or passive and are connected or otherwise coupled together to provide the described function.

As will be described in detail hereinafter, various embodiments of an electrical power unit configured to rotate a crankshaft to start an engine and a method for rotating the crankshaft to start the engine using the electrical power unit are presented. The exemplary electrical power unit may be employed in propulsion systems, such as aircrafts. Also, the exemplary power unit may be used in marine systems. In addition to starting the engine using the electrical power unit, the electrical power unit may be configured to provide electrical power to activate loads employed in the propulsion systems and/or marine systems. As will be appreciated, use of the autotransformers typically increases the footprint of the electrical power unit. The design of the exemplary electrical power unit aids in avoiding use of autotransformers in the electrical power unit. Further, the exemplary electrical power unit facilitates optimal utilization of associated electrical machines and power converters.

Figure 1:
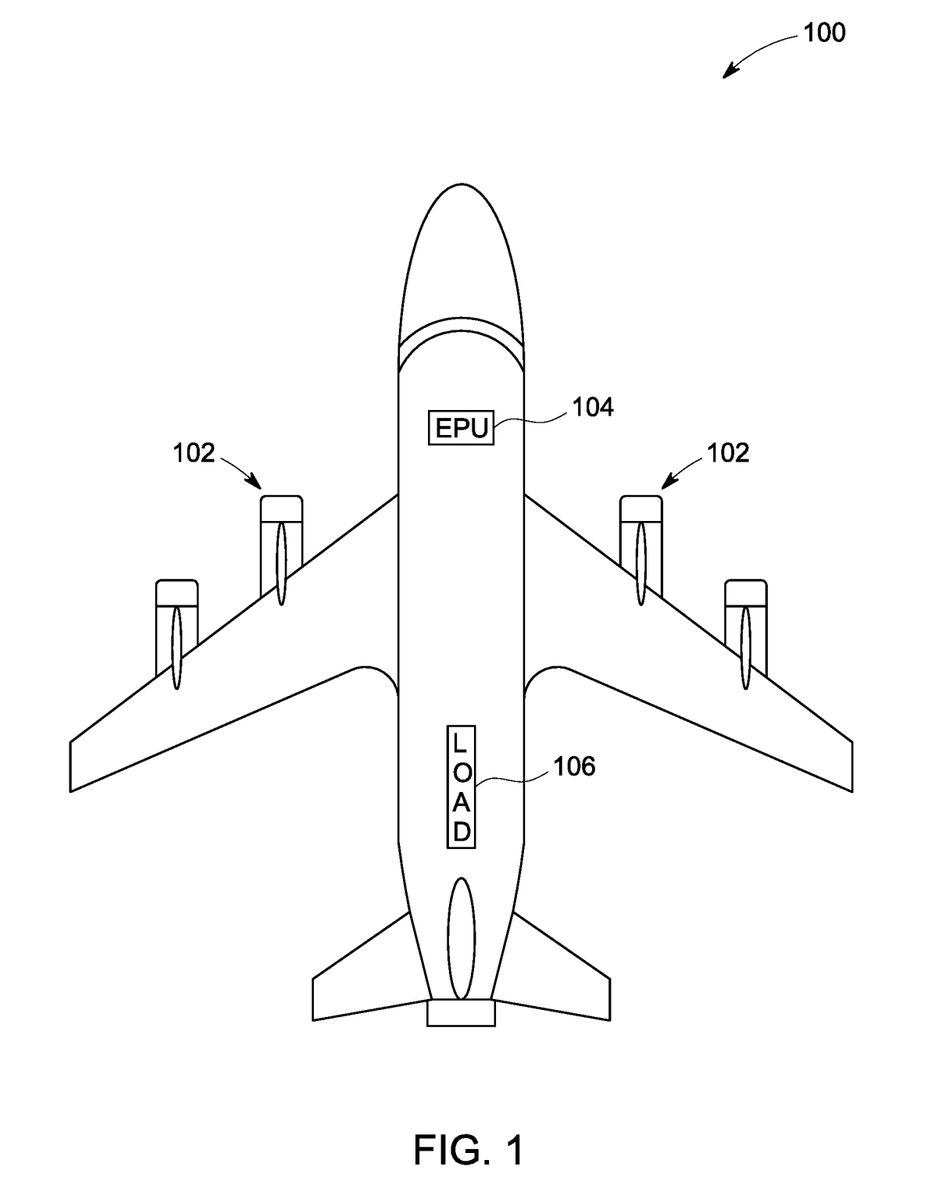
FIG. 1 is a diagrammatical representation of a propulsion system having an exemplary electrical power unit, according to aspects of the present specification.

Turning now to the drawings, FIG. 1 is a diagrammatical representation 100 of a propulsion system having an exemplary electrical power unit. The propulsion system 100 includes two engines 102, an electrical power unit 104, and a plurality of loads 106. The electrical power unit 104 is coupled to the two engines 102. Further, the electrical power unit 104 is configured to be operatively coupled to the plurality of loads 106.

In one embodiment, the propulsion system 100 is an aircraft. Further, each of the engines 102 is disposed in the aircraft and may be referred to as aircraft engines. In the propulsion system 100, the plurality of loads 106 includes air conditioners, ventilators, environment control system (ECS) motors, and the like.

Although the example of FIG. 1 represents use of a single electrical power unit 104, use of a plurality of electrical power units 104 is anticipated. In the example where the plurality of electrical power units is employed, each engine is coupled to a corresponding electrical power unit. In another embodiment, a single electrical power unit 104 may be coupled to more than one engine 102. Also, although the example of FIG. 1 depicts the electrical power unit 104 and the loads 106 as being disposed in the main body of the propulsion system 100, positioning of the electrical power unit 104 and the loads 106 at different locations in the propulsion system 100 is envisaged. The electrical power unit 104 and the method of operating the electrical power unit 104 will be described in greater detail with respect to FIGS. 2-7.

Figure 2:
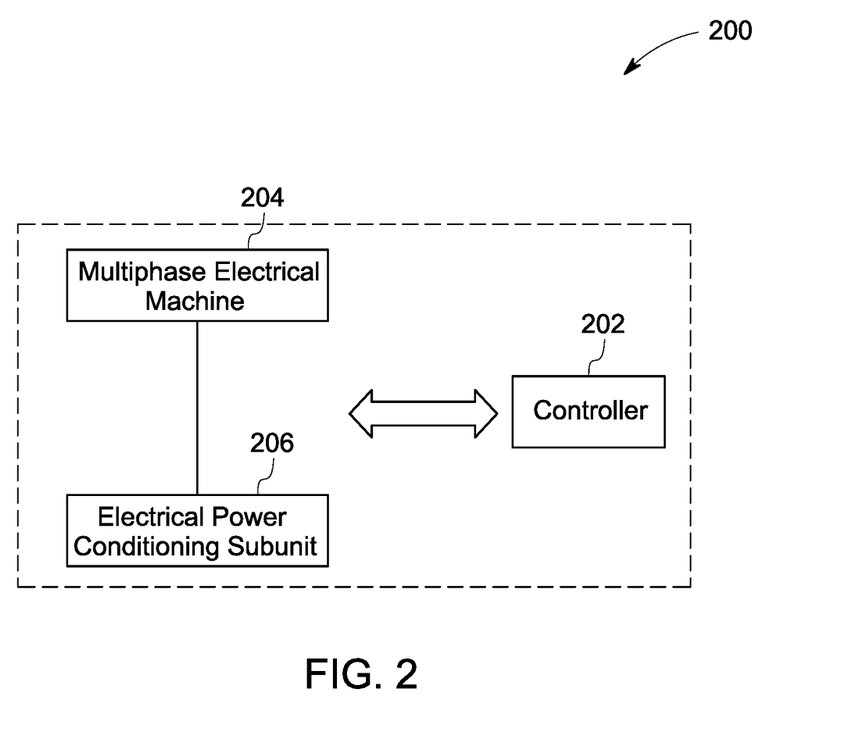
FIG. 2 is a diagrammatical representation of one embodiment of the electrical power unit of FIG. 1, according to aspects of the present specification.

Referring now to FIG. 2, a diagrammatical representation 200 of one embodiment of the electrical power unit 104 of FIG. 1 is presented. FIG. 2 is described with reference to the components of FIG. 1.

In a presently contemplated configuration, the electrical power unit 200 includes a controller 202, a multiphase electrical machine 204, and an electrical power conditioning subunit 206. The multiphase electrical machine 204 is configured to be operatively coupled to the electrical power conditioning subunit 206. The multiphase electrical machine 204 is also operatively coupled to an engine, such as the engine 102 of FIG. 1. In particular, the multiphase electrical machine 204 is operatively coupled to the engine using a crankshaft (not shown in FIG. 2). Also, the electrical power conditioning subunit 206 is operatively coupled to the controller 202.

In accordance with aspects of the present specification, the electrical power conditioning subunit 206 is configured to aid in transmitting electrical power to and from the multiphase electrical machine 204. The controller 202 is configured to control operation of the electrical power conditioning subunit 206. In particular, the controller 202 aids in transmission of electrical power to and from the multiphase electrical machine 204 using the electrical power conditioning subunit 206 based on an operating state of the engine. The term "operating state of the engine," as used herein, refers to an idle state or a powered state of the engine.

In one embodiment, the multiphase electrical machine 204 is configured to operate as a motor in order to enable starting of the engine. When operating as a motor, the multiphase electrical machine 204 is configured to generate and provide an output mechanical power to rotate the crankshaft. As noted hereinabove, the crankshaft is coupled to the engine. As a result of rotation of the crankshaft, the engine 102 is started. Particularly, based on the rotation of the crankshaft a mechanical torque is provided to the engine 102 which in turn starts the engine 102. Alternatively, the rotation of the crankshaft is used to start the engine. Subsequent to start of the engine, the engine operates in a powered state. The multiphase electrical machine 204 may be configured to operate as a generator, once the engine is powered. It may be noted that to operate the multiphase electrical machine 204 as a generator, an input mechanical power is provided from the powered engine to the multiphase electrical machine 204.

Further, in one embodiment, the multiphase electrical machine 204 is a wound rotor synchronous machine. In this example, the multiphase electrical machine 204 includes a plurality of three-phase windings (not shown in FIG. 2). Each of the plurality of three-phase windings is a stator winding. The three-phase windings may be alternatively referred to as three-phase stator windings. In one embodiment, the multiphase electrical machine 204 is a six-phase electrical machine. In yet another embodiment, the multiphase electrical machine 204 is a nine-phase electrical machine. The six-phase electrical machine includes two sets of three-phase windings, while the nine-phase electrical machine includes three sets of three-phase windings. The multiphase electrical machine 204 may also include a field winding (not shown in FIG. 2).

The electrical power conditioning subunit 206 includes a plurality of converters. Each converter is a three-phase converter and includes a three-phase output terminal. In one embodiment, the converter may be an inverter. Furthermore, each converter includes a plurality of semiconductor switches. Some non-limiting examples of the semiconductor switches include an insulated gate bipolar transistor, a metal oxide semiconductor field effect transistor, a field-effect transistor, an injection enhanced gate transistor, an integrated gate commutated thyristor, and the like. In another example, the semiconductor switches include a gallium nitride based switch, a silicon carbide based switch, a gallium arsenide based switch, and the like.

Additionally, the electrical power conditioning subunit 206 includes a plurality of switches. The electrical power conditioning subunit 206 also includes a direct current (DC) bus, a synchronizing line, a plurality of rectifiers, and a plurality of filters. The switches of the electrical power conditioning subunit 206 enable coupling of the multiphase electrical machine 204 to a load such as the load 106 of the propulsion system 100 of FIG. 1. In another embodiment, the switches in the electrical power conditioning subunit 206 enable coupling of an external power source to the multiphase electrical machine 204. The arrangement of the switches, the DC bus, the synchronizing line, the rectifiers, the filters, and the converters and the coupling of the multiphase electrical machine 204 to loads/external power sources will be described in greater detail with respect to FIGS. 3-4.

As noted hereinabove, electrical power unit 200 includes the controller 202. As used herein, the term "controller" refers to integrated circuits (ICs), a computer, a microcontroller, a microcomputer, a programmable logic controller (PLC), an application specific integrated circuit (ASIC), application-specific processors, digital signal processors (DSPs), Field Programmable Gate Arrays (FPGAs), and/or any other programmable circuits. In one embodiment, the controller 202 includes an aircraft main controller, a local controller, or a combination thereof. Moreover, in certain embodiments, the local controller may be disposed in the electrical power conditioning subunit 206.

Furthermore, as previously noted, the controller 202 is configured to control the operation of the engine 102. To that end, the controller 202 is configured to generate a first control signal based on a first operational state of the engine 102. The first operational state is an idle state of the engine 102. The term "idle state of the engine," as used herein, refers to a state of the engine before the engine is started/powered. The controller 202 is configured to generate the first control signal when the engine 102 is in the idle state and has to be started.

In one example, the first control signal includes a first switching pattern corresponding to the switches of the electrical power conditioning subunit 206. The term "switching pattern," as used herein, is a pattern according to which different switches of the electrical power conditioning subunit 206 are opened or closed. The term "switching," as used herein, refers to closing and/or opening the switches. The controller 202 is configured to switch switches of the electrical power conditioning subunit 206 based on the first switching pattern. The first control signal aids in switching the switches in the electrical power conditioning subunit 206 to establish an electrical connection between each converter in the electrical power conditioning subunit 206 and a corresponding three-phase winding in the multiphase electrical machine 204. In accordance with aspects of the present specification, each converter in the electrical power conditioning subunit 206 is operatively coupled to a corresponding three-phase winding in the multiphase electrical machine 204 by switching the switches of the electrical power conditioning subunit 206 based on the first switching pattern. In particular, each converter is electrically coupled to the corresponding three-phase winding in the multiphase electrical machine 204 by switching the switches based on the first switching pattern. Subsequent to the electrical coupling of each converter to the corresponding three-phase winding, the electrical power conditioning subunit 206 is configured to transmit a first electrical power from each converter to the corresponding three-phase winding of the multiphase electrical machine 204. The switching of the switches of the electrical power conditioning subunit 206 based on the first switching pattern will be explained in greater detail with respect to FIG. 3.

Subsequent to receipt of the first electrical power, the multiphase electrical machine 204 is configured to process the first electrical power to generate a mechanical power. Further, the multiphase electrical machine 204 supplies the generated mechanical power to the crankshaft that is operatively coupled to the engine 102. The mechanical power is used to rotate the crankshaft. For ease of explanation, the mechanical power generated by the multiphase electrical machine 204 is referred to as an output mechanical power. Further, the rotation of the crankshaft is employed to start the engine 102. According to aspects of the present specification, based on the rotation of the crankshaft, a mechanical torque is provided to the engine 102 which in turn starts the engine 102. In this scenario, the multiphase electrical machine 204 operates as a motor.

The electrical coupling of each converter to the corresponding three-phase winding and subsequent transmission of the first electrical power from each converter to the corresponding three-phase winding aids in utilization of the multiphase electrical machine 204 and each of the converters to their full capacity. By way of example, if the multiphase electrical machine 204 is rated at 500 kW, the multiphase electrical machine 204 may be configured to provide electrical power to a 500 kW rated load. It may be noted that if the multiphase electrical machine 206 is operated at half capacity, the multiphase electrical machine may be able to convey power to a 250 kW rated load.

Furthermore, as previously noted, each three-phase converter is coupled to a corresponding three-phase winding of the multiphase electrical machine 204. Accordingly, each three-phase winding of the multiphase electrical machine 204 is provided a three-phase power/current by a corresponding converter. Since each three-phase winding of the multiphase electrical machine 204 is provided a three-phase power/current by a corresponding converter, it may be noted that the multiphase electrical machine 204 and the converters operate at their full capacity. However, in a scenario where only a single three-phase converter conveys three-phase power to a combination of the three-phase windings of the multiphase electrical machine 204, the multiphase electrical machine may operate at partial capacity. Similarly, if two three-phase converters provide power to a single three phase winding, then the three-phase converters may operate at partial capacity.

Additionally, the controller 202 is also configured to generate a second control signal based on a second operational state of the engine 102. The second operational state includes a powered state of the engine. The term "powered state of the engine," as used herein, refers to a running state of the engine or a state of the engine subsequent to starting of the engine. In accordance with aspects of the present specification, the controller 202 is configured to generate the second control signal when the engine 102 is in the powered state and it is desirable to provide power to the loads 106 using the multiphase electrical machine 204. The second control signal includes a second switching pattern corresponding to the switches of the electrical power conditioning subunit 206. The controller 202 is configured to switch the switches of the electrical power conditioning subunit 206 according to the second switching pattern. The second switching pattern is different from the first switching pattern. The second control signal aids in switching the switches in the electrical power conditioning subunit 206 to establish an electrical connection between the multiphase electrical machine 204 and one load of a plurality of loads, via one converter in the electrical power conditioning subunit 206.

In the example of FIG. 2, the multiphase electrical machine 204 is electrically coupled to one load of a plurality of loads, via one converter in the electrical power conditioning subunit 206 based on switching of the switches of the electrical power conditioning subunit 206 according to the second switching pattern. The switching of the switches of the electrical power conditioning subunit 206 according to the second switching pattern will be described in greater detail with respect to FIG. 3.

Subsequent to starting the engine 102, the engine 102 may operate in a powered state. While the engine 102 is operating in the powered state, the engine 102 is configured to generate mechanical power. This mechanical power is provided as an input to the multiphase electrical machine 204 when the multiphase electrical machine 204 operates as a generator. For ease of explanation, this mechanical power may be referred to as an input mechanical power. The multiphase electrical machine 204 is configured to process the input mechanical power provided by the powered engine to generate a second electrical power. The multiphase electrical machine 204 is configured to convey the second electrical power to one load via the corresponding converter to activate that load.

In accordance with aspects of the present specification, the exemplary electrical power unit 200 is configured to serve as a starter-generator subsystem to the propulsion system 100 via use of multiphase electrical machine 204. In particular, the multiphase electrical machine 204 operates as a motor to electrically start the engine 102 and as a generator to provide electrical power to the load subsequent to starting of the engine 102. The electrical power conditioning subunit 206 in combination with the controller 202 aids in operating the multiphase electrical machine 204 as the generator/motor.

Figure 3:
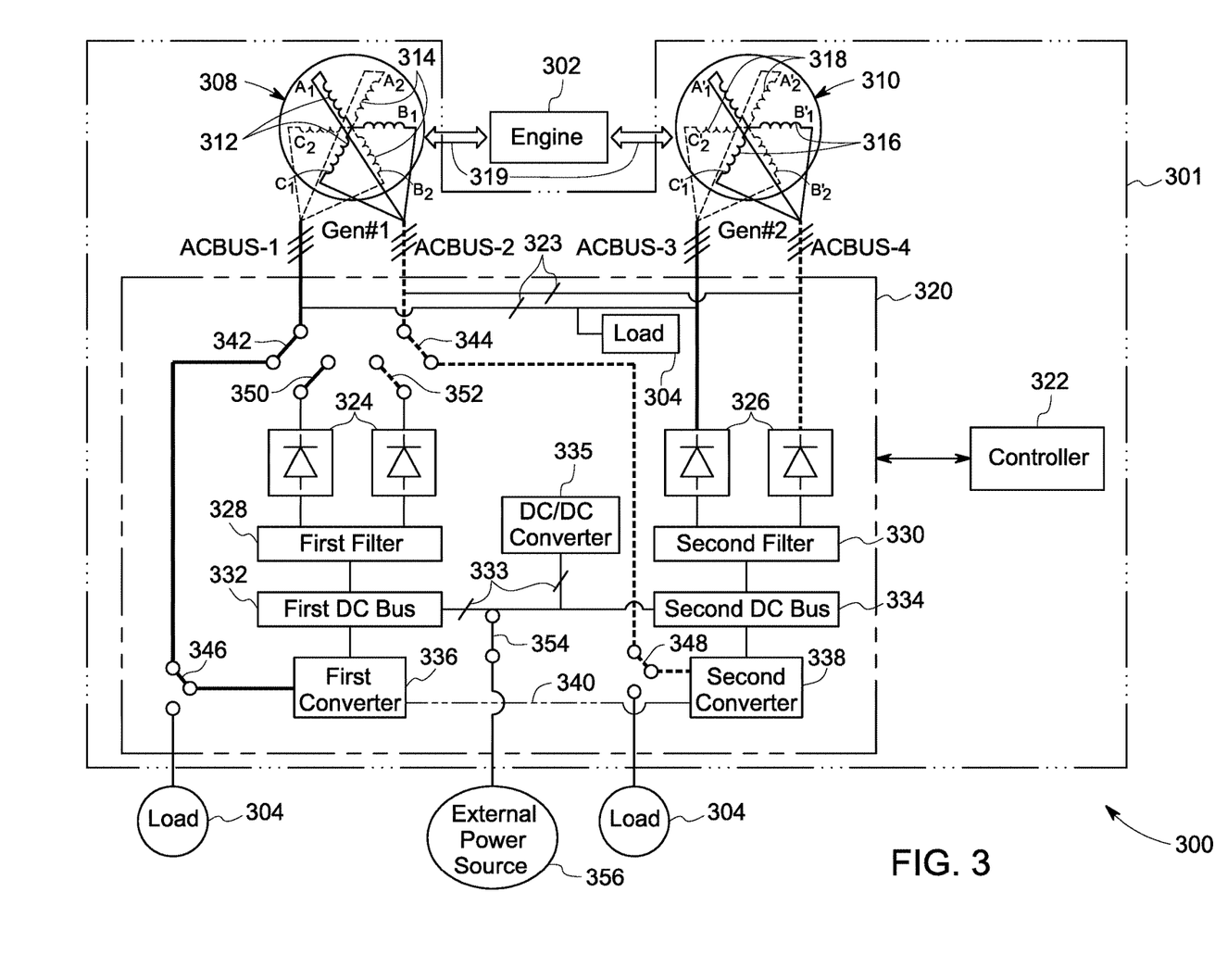
FIG. 3 is a detailed diagrammatical representation of one embodiment of the electrical power unit of FIG. 1, according to aspects of the present specification.

FIG. 3 is detailed diagrammatical representation 300 of one embodiment of the electrical power unit 104 of FIG. 1, according to aspects of the present specification. In particular, FIG. 3 represents an electrical power unit 301 that is operatively coupled to an engine 302. In the present example, the electrical power unit 301 and the engine 302 are disposed in a propulsion system, such as an aircraft. Further, the electrical power unit 301 is configured to be operatively coupled to a plurality of loads 304 and provide power to the loads 304. Although the example of FIG. 3 depicts use of three loads, the electrical power unit 301 may be configured to provide power to a greater number of loads or a lower number of loads. The loads 304 may include an AC load and/or a DC load.

In the example of FIG. 3, the electrical power unit 301 includes a first multiphase electrical machine 308 and a second multiphase electrical machine 310. In one embodiment, the first multiphase electrical machine 308 is a high spool generator of the aircraft and the second multiphase electrical machine 310 is a low spool generator of the aircraft.

Furthermore, each of the first multiphase electrical machine 308 and the second multiphase electrical machine 310 may be a six-phase electrical machine. The first multiphase electrical machine 308 includes a first three-phase winding 312 and a second three-phase winding 314. The first three-phase winding 312 is represented by windings A1, B1, C1 and the second three-phase winding 314 is represented by windings A2, B2, C2. In a similar manner, the second multiphase electrical machine 310 includes a third three-phase winding 316 and a fourth three-phase winding 318. The third three-phase winding 316 is represented by windings A1', B1', C1' and the fourth three-phase winding 318 is represented by windings A2', B2', C2'. The first and second three-phase windings 312, 314 are stator windings of the first multiphase electrical machine 308. Similarly, the third and fourth three-phase windings 316, 318 are stator windings of the second multiphase electrical machine 310. In addition, the first multiphase electrical machine 308 and the second multiphase electrical machine 310 include corresponding field windings (not shown in FIG. 3).

Moreover, the first multiphase electrical machine 308 and the second multiphase electrical machine 310 are coupled to the engine 302. In one embodiment, the first multiphase electrical machine 308 and the second multiphase electrical machine 310 are coupled to the engine 302 via a crankshaft 319, a gearbox, and other auxiliary connectors.

Further, the electrical power unit 301 also includes an electrical power conditioning subunit 320 and a controller 322. The first multiphase electrical machine 308 and the second multiphase electrical machine 310 are configured to be coupled to the electrical power conditioning subunit 320 via a first AC bus ACBUS-1, a second AC bus ACBUS-2, a third AC bus ACBUS-3, and a fourth AC bus ACBUS-4. In one embodiment, the first AC bus ACBUS-1 is coupled to the third AC bus ACBUS-3 via an AC breaker 323. Further, the second AC bus ACBUS-2 is coupled to the fourth AC bus ACBUS-4 via another AC breaker 323. Moreover, AC loads may be coupled to the first, second, third, or fourth AC buses. The first, second, third, and fourth AC buses are configured to provide an AC power to the AC loads. In one embodiment, at least a portion of the first AC bus ACBUS-1, the second AC bus ACBUS-2, the third AC bus ACBUS-3, and the fourth AC bus ACBUS-4 may be disposed in the electrical power conditioning subunit 320. In addition, the controller 322 is operatively coupled to the electrical power conditioning subunit 320.

The electrical power conditioning subunit 320 includes first rectifiers 324, second rectifiers 326, a first filter 328, a second filter 330, a first DC bus 332, a second DC bus 334, a first converter 336, and a second converter 338. In one embodiment, the first rectifiers 324 and the second rectifiers 326 are diode bridge rectifiers. In another embodiment, the first rectifiers 324 and the second rectifiers 326 may be AC/DC converters. Although the example of FIG. 3 illustrates two first and second rectifiers, use of any number of rectifiers is anticipated.

Also, the first rectifiers 324 are coupled to the first filter 328 and the second rectifiers 326 are coupled to the second filter 330. The first filter 328 and the second filter 330 include inductor-capacitor (LC) based filters. In another embodiment, the first filter 328 and the second filter 330 may include a combination of an interphase transformer (coupled inductors) and a capacitor.

Furthermore, the first filter 328 is coupled to the first DC bus 332 and the second filter 330 is coupled to the second DC bus 334. In one example, the first DC bus 332 and the second DC bus 334 are coupled to one another and may operate as a single DC bus. The first DC bus 332 may be coupled to the second DC bus 334 via a DC breaker 333. In one embodiment, a 270V/28V DC/DC converter 335 may be coupled to the first and second DC buses 332, 334. Further, the 270V/28V DC/DC converter 335 may be coupled to a DC load. In one embodiment, the first and second DC buses 332, 334 may convey a DC power to the DC load via the 270V/28V DC/DC converter 335 to activate the DC load.

With continuing reference to FIG. 3, the first DC bus 332 is coupled to the first converter 336 and the second DC bus 334 is coupled to the second converter 338. In one embodiment, each of the first converter 336 and the second converter 338 is an environmental control system inverter. In certain embodiments, the first converter 336 and the second converter 338 may be three-phase inverters.

In one embodiment, the controller 322 is configured to control operation of the first converter 336 and the second converter 338. As previously noted with respect to FIG. 2, the controller 322 may include a local controller (now shown in FIG. 3) disposed in the electrical power conditioning subunit 320. The local controller may in turn include a plurality of control units (not shown in FIG. 3). In one embodiment, different control units may be configured to control the operation of the first converter 336 and the second converter 338. In another embodiment, the same control unit(s) may be employed to control the operation of the first and second converters 336, 338.

In the embodiment where different control units are configured to control the operation of the first converter 336 and the second converter 338, a synchronizing line 340 is employed to couple the first converter 336 to the second converter 338. In particular, the synchronizing line 340 is employed to operatively couple the different control units of the first and second converters 336, 338. Although the synchronizing line 340 is represented as a physically wired connection in the example of FIG. 3, use of a wireless connection is also anticipated. The synchronizing line 340 is configured to enable communication of operational parameters between the first converter 336 and the second converter 338. The term "operational parameters," as used herein, refers to parameters such as a magnitude, a phase, a frequency, and zero crossing point of voltage/current waveforms generated by the first converters 336 and the second converter 338.

Furthermore, the electrical power conditioning subunit 320 includes two first switches 342, 344, two second switches 346, 348, two third switches 350, 352, and one fourth switch 354. The first switch 342 is disposed between the first converter 336 and the first three-phase winding 312 and the first switch 344 is disposed between the second converter 338 and the second three-phase winding 314. Further, the second switch 346 is disposed between the first converter 336 and the first switch 342. Alternatively, the second switch 346 may be disposed between the first converter 336 and one of the plurality of loads 304. The second switch 348 is disposed between the second converter 338 and the first switch 344. Alternatively, the second switch 348 may be disposed between the second converter 338 and another load of the plurality of loads 304.

Moreover, the third switch 350 is disposed between one of the first rectifiers 324 and the first three-phase winding 312. Also, the third switch 352 is disposed between the other first rectifier 324 and the second three-phase winding 314. The fourth switch 354 is disposed between the first and second DC buses 332, 334 and an external power supply 356. The external power supply 356 is a power source configured to provide DC power to the first multiphase electrical machine 308.

In one embodiment, the switches 342, 344, 346, 348, 350, 352, 354 may include at least one of mechanical relays, contactors, and circuit breakers. In another embodiment, the switches 342, 344, 346, 348, 350, 352, 354 are semiconductor switches. Some non-limiting examples of the semiconductor switches include an insulated gate bipolar transistor, a metal oxide semiconductor field effect transistor, a field-effect transistor, an injection enhanced gate transistor, an integrated gate commutated thyristor, and the like. In another embodiment, the semiconductor switches may include a gallium nitride based switch, a silicon carbide based switch, a gallium arsenide based switch, and the like. The controller 322 is configured to control switching of the switches 342, 344, 346, 348, 350, 352, 354. As noted hereinabove, the term "switching," as used herein, refers to closing and/or opening the switches.

As will be appreciated, to start the engine 302, it is desirable to provide mechanical power to the engine 302. In accordance with aspects of the present specification, initially, an electrical power is provided to the first multiphase electrical machine 308. It may be noted that the controller 322 and the electrical power conditioning subunit 320 are employed to provide the electrical power to the first multiphase electrical machine 308. The first multiphase electrical machine 308 is configured to generate an output mechanical power based on the electrical power. The output mechanical power generated by the first multiphase electrical machine 308 is employed to start the engine 302.

In accordance with aspects of the present specification, the controller 322 is configured to generate a first control signal based on a first operational state of the engine 302. As previously noted, the first operational state of the engine 302 is representative of an idle state of the engine 302. The controller 322 is configured to generate the first control signal when the engine 302 is in the idle state and has to be started. In one example, the first control signal includes a first switching pattern corresponding to the switches 342, 344, 346, 348, 350, 352, 354. In particular, the first switching pattern provides a pattern for opening or closing the switches 342, 344, 346, 348, 350, 352, 354. In accordance, with aspects of the present specification, the first control signal aids in switching the first switches 342, 344 to establish an electrical connection between the first converter 336 and the first three-phase winding 312. Similarly, the first control signal also aids in switching the second switches 346, 348 to establish an electrical connection between the second converter 338 and the second three-phase winding 314. More specifically, the first switches 342, 344 are closed to couple the first converter 336 to the first three-phase winding 312 and the second switch 346 is closed to couple the second converter 338 to the second three-phase winding 314. Furthermore, the first control signal aids in switching the fourth switch 352. In particular, the fourth switch 352 is closed to electrically couple the external power supply 356 to the first and second DC buses 332, 334.

Once the electrical connections are established based on the first control signal, a first electrical power is provided to the first and second DC buses 332, 334. In particular, the external power supply 356 provides the first electrical power to the DC buses 332, 334. In one embodiment, the first electrical power is a DC power. The first electrical power is subsequently conveyed to the first and the second converters 336, 338 via the first and second DC buses 332, 334. The first and the second converters 336, 338 convert the DC power into a first three-phase AC power and a second three-phase AC power, respectively. The first three-phase AC power is provided from the first converter 336 to the first three-phase winding 312. In a similar manner, the second three-phase AC power is provided from the second converter 338 to the second three-phase winding 314. Based on the first three-phase AC power provided to the first three-phase winding, a determined value of current flows through the first three-phase winding. In a similar manner, based on the second three-phase AC power provided to the second three-phase winding, a determined value of current flows through the second three-phase winding 314.

As noted hereinabove, the operational parameters are communicated between the first converter 336 and the second converter 338. These operational parameters include a magnitude, a phase, a frequency, and a zero-crossing point of voltage/current waveforms generated by the first converter 336 and the second converter 338. In one example, the communication of operational parameters from the first converter 336 to the second converter 338 aids in adjusting a pulse width modulation (PWM) signal of the second converter 338 such that a desired value of an output voltage is generated at the output of the second converter 338. As will be appreciated, in one example, a PWM signal is employed for modulating a switching frequency in a converter to generate an output voltage/power signal having a desired magnitude and frequency.

In one embodiment where the first multiphase electrical machine 308 is a six-phase electrical machine, the PWM signals of the first or second converters 336, 338 are adjusted based on the communicated operational parameters such that the first three-phase AC power and the second three-phase AC power have a phase difference of about 30 degrees. Providing the first three-phase AC power and the second three-phase AC power to the first three-phase winding 312 and the second three-phase winding 314 respectively, aids the first three-phase winding 312 and the second three-phase winding 314 in generating maximum torque per ampere. The maximum torque per ampere generated by the first three-phase winding 312 and the second three-phase winding 314 allows use of the first multiphase electrical machine 308 at its full capacity.

As will be appreciated, each of the three phase windings 312, 314 of the first multiphase electrical machine 308 has a prescribed current rating. As noted hereinabove, a power having a phase difference of about 30 degrees is provided to the first three-phase winding 312 and the second three-phase winding 314. As a result of power provided to each of the three-phase windings 312, 314, a current flows through each of three-phase winding 312, 314. If the rating of each of the three-phase windings 312, 314 is about 100 A, each of the three phase windings 312, 314 can carry a current having a value of 100 A. When a full value of current flows through both the three-phase windings, the first multiphase electrical machine 308 generates maximum torque. Thus, the first multiphase electrical machine 308 operates at its full capacity. In conventional systems, two three-phase windings of an electrical machine may be coupled to one another using an auxiliary winding. In such a scenario, a circulating current flows through the auxiliary winding. Consequently, a full value of current does not flow through each of the three-phase windings. Hence, the electrical machine does not generate maximum torque and therefore, does not operate at its full capacity.

Although the example of FIG. 3 describes a phase difference of about 30 degrees between the first and second three-phase AC powers provided to the first and second three-phase windings 312, 314, the value of phase difference may vary based on the number of phases associated with the first multiphase electrical machine 308.

The first multiphase electrical machine 308 is configured to generate a mechanical power based on the three-phase AC power provided to each of the first and second three-phase windings of the first multiphase electrical machine 308. Subsequently, this mechanical power is provided to the crankshaft 319 that is operatively coupled to the engine 302. In this scenario, the first multiphase electrical machine 308 operates as a motor. The crankshaft 319 is rotated based on the mechanical power provided by the first multiphase electrical machine 308 to start the engine 302. Particularly, a mechanical torque is provided to the engine 302 based on the rotation of the crankshaft 319. It is desirable that torque generated by the first multiphase electrical machine 308 has a value that is greater than a drag torque of the engine 302 to start the engine 302. The term "drag torque," as used herein, is a frictional torque required to overcome internal friction to rotate a fan of an aircraft engine.

In accordance with aspects of the present specification, only the first multiphase electrical machine 308 is required for starting the engine 302. Although the example of FIG. 3 describes starting the engine 302 using the first multiphase electrical machine 308, use of the second multiphase electrical machine 310 for starting the engine is also anticipated. However, if the second multiphase electrical machine 310 is employed for starting the engine 302, the arrangement of switches in the electrical power conditioning subunit 320 may vary in order to allow starting of the engine 302 using the second multiphase electrical machine 310.

Figure 4:
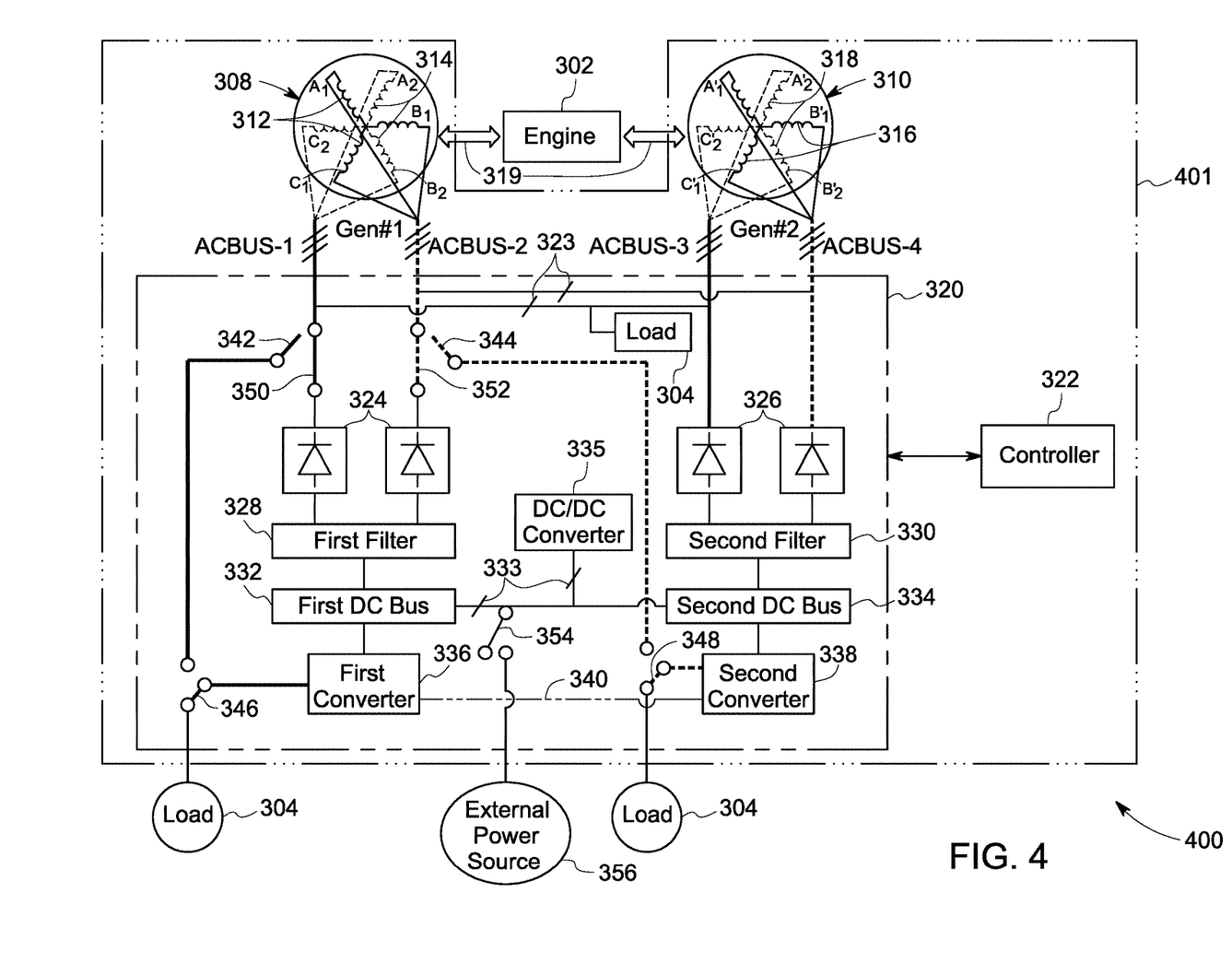
FIG. 4 is a detailed diagrammatical representation of another embodiment of the electrical power unit of FIG. 1, according to aspects of the present specification.

Turning now to FIG. 4, a detailed diagrammatical representation 400 of another embodiment of the electrical power unit of FIG. 1, according to aspects of the present specification, is presented. In particular, FIG. 4 is a diagrammatical representation of the electrical power unit 301 of FIG. 3 subsequent to starting of an engine 302. Accordingly, FIG. 4 is described with respective to the various components of FIG. 3.

In the example of FIG. 4, an electrical power unit 401 is operatively coupled to the engine 302. The electrical power unit 401 includes the first multiphase electrical machine 308 and the second multiphase electrical machine 310. Further, the electrical power unit 401 includes the controller 322 that is operatively coupled to the electrical power conditioning subunit 320.

In accordance with aspects of the present specification, subsequent to starting the engine 302, the controller 322 is configured to generate a second control signal based on a second operational state of the engine. The second operational state of the engine 302 is representative of a powered state of the engine 302. Particularly, the controller 322 is configured to generate the second control signal when the engine 302 is in the powered state and it is desirable to provide power to the loads 304 using the multiphase electrical machines 308, 310. In one example, the second control signal includes a second switching pattern corresponding to the switches 342, 344, 346, 348, 350, 352, 354. In particular, the second switching pattern is another pattern for opening or closing the switches 342, 344, 346, 348, 350, 352, 354.

The second control signal also aids in switching the first switches 342, 344, the second switches 346, 348, the third switches 350, 352 and the fourth switch 354. In particular, the first switches 342, 344 and fourth switch 354 are opened. Further, the second switch 346 is closed to connect the first converter 336 to one of the loads 304 and the second switch 348 is closed to connect the second converter 338 to another load of the loads 304. Moreover, the third switches 350, 352 are closed to connect the ACBUS-1 to one of the first rectifiers 324 and ACBUS-2 to the other first rectifier 324. Therefore, an electrical connection is established between the first three-phase winding 312 and one of the first rectifiers 324 and an electrical connection is established between the second three-phase winding 314 and the other first rectifier 324. Further, the first rectifiers 324 are electrically coupled to one of the plurality of loads 304 via the first filter 328, the first DC bus 332, and the first converter 336. Particularly, the first and second three-phase windings 312, 314 of the first multiphase electrical machine 308 are electrically coupled to one load the plurality of loads 304.

Further, an electrical connection is established between the third three-phase winding 316 and one of the second rectifiers 326 and an electrical connection is established between the fourth three-phase winding 318 and the other second rectifier 326. Also, the second rectifiers 326 are coupled to another load of the plurality of loads 304 via the second filter 330, the second DC bus 334, and the second converter 338. In particular, the third and fourth three-phase windings 316, 318 of the second multiphase electrical machine 310 are electrically coupled to the other loads via the second rectifier 326, the second filter 330, the second DC bus 334 and the second converter 338.

The powered engine 302 is configured to generate and provide an input mechanical power to the first multiphase electrical machine 308 and the second multiphase electrical machine 310 to enable operation of the first and second multiphase electrical machines 308, 310 as generators. The first and second multiphase electrical machine 308, 310 are in turn configured to generate a second electrical power based on the input mechanical power provided by the engine 302. In one embodiment, each of the first and second multiphase electrical machine 308, 310 generates a second electrical power. Further, the second electrical power generated by both the first and second multiphase electrical machine 308, 310 are provided to the plurality of loads 304 to activate the loads 304.

As noted hereinabove, the first multiphase electrical machine 308 includes the first and second three-phase windings 312, 314, and the second multiphase electrical machine 310 includes the third and fourth three-phase windings 316, 318. Each of the first and second three-phase windings 312, 314 of the first multiphase electrical machine 308 generate a second electrical power. Similarly, each of the third and fourth three-phase windings 316, 318 of the second multiphase electrical machine 310 generate a second electrical power. The second electrical power is a three-phase power. Thus, each of the first multiphase electrical machine 308 and the second multiphase electrical machine 310 generates two sets of three-phase powers at a phase difference of about 30 degrees.

It may be noted that each set of three phase powers corresponding to each of the multiphase electrical machine 308, 310 has corresponding ripples. Furthermore, due to the phase difference of about 30 degrees between the two sets of three-phase powers generated by each of the multiphase electrical machine 308, 310, the corresponding ripples are also phase shifted by 30 degrees. This phase shift between the corresponding sets of the ripples results in a cumulative ripple component at the output of the each of the filters 328, 330 that has a lower magnitude when compared to a magnitude of a ripple component generated by an electrical machine having a single set of three-phase windings. This reduction in the magnitude of the ripple component in the power generated by each of the first multiphase and second multiphase electrical machines 308, 310 advantageously results in a reduction in filtering requirement for the three-phase electrical power generated by the first and second multiphase electrical machines 308, 310. Consequently, the first filter 228 and the second filter 330 having a size that is smaller than the size of conventionally used filters may be employed in the electrical power unit 401. Also, use of autotransformers at the output of the first and second multiphase electrical machines 308, is circumvented, thereby reducing the footprint of the electrical power unit 401.

Figure 5:
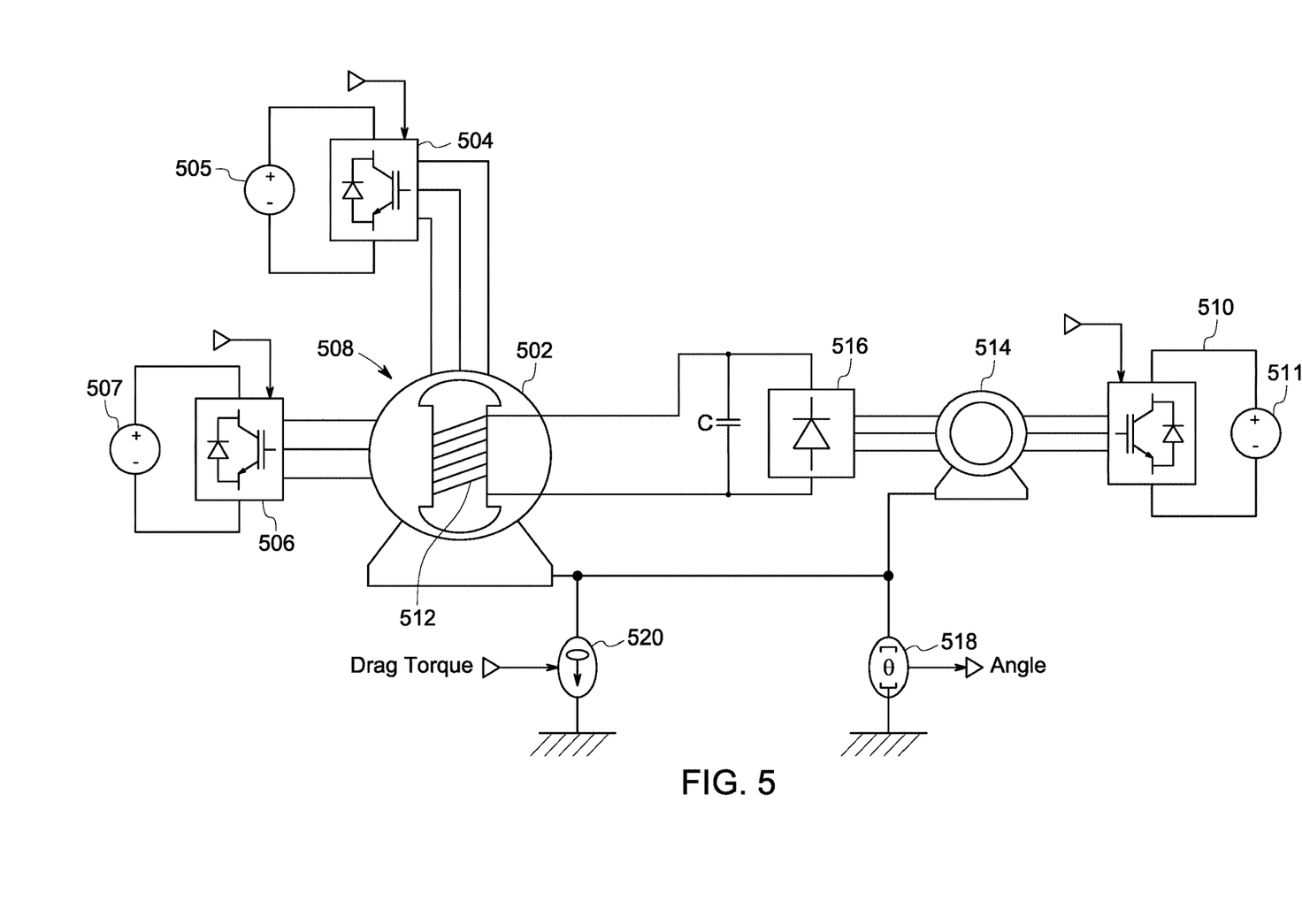
FIG. 5 is a diagrammatical representation of a multiphase electrical machine for use in the electrical power unit of FIG. 1, according to aspects of the present specification.

FIG. 5 is a detailed diagrammatical representation 500 of a multiphase electrical machine for use in the electrical power unit 104 of FIG. 1, according to aspects of the present specification. In particular, FIG. 5 depicts a multiphase electrical machine 502 such as the first multiphase electrical machine 308 of FIG. 3 and associated circuitry to enable operation of the multiphase electrical machine 502.

The multiphase electrical machine 502 includes two sets of three-phase stator windings 508 and a field winding 512. In the example of FIG. 5, the multiphase electrical machine 502 is depicted as being coupled to two converters 504, 506. These converters 504, 506 are similar to the first and the second converters 336, 338 of FIG. 3. Although the example of FIG. 5 depicts use of two converters, the number of converters may vary based on the type of application. Also, the multiphase electrical machine 502 is coupled to an aircraft engine (not shown in FIG. 5) such as the engine 302 of FIG. 3 using a crankshaft such as the crankshaft 319 of FIG. 3.

It may be noted that these converters 504, 506 are coupled to different three-phase stator windings 508 of the multiphase electrical machine 502. In the example of FIG. 5, the converters 504, 506 are operatively coupled to power sources 505, 507, respectively. Although the example of FIG. 5 represents the power sources 505, 507 as providing power to the converters 504, 506, supply of the power to the converters 504, 506 using an external power supply, such as the external power supply 356 of FIG. 3 and via a corresponding DC bus, such as the DC buses 332, 334 of FIG. 3 is also envisaged. Each of the converters 504, 506 converts a respective DC power input by the power sources 505, 507 and provides a three-phase AC power to corresponding three-phase stator windings 508. Alternatively, a three-phase AC current may be provided to the corresponding three-phase stator windings 508.

In addition to the three-phase AC power/current provided to corresponding three-phase stator windings 508, an AC power/current is provided to the field winding 512 to enable appropriate operation of the multiphase electrical machine 502. An exciter inverter 510 is coupled to the field winding 512 of the multiphase electrical machine 502 via an exciter machine 514 and a diode rectifier 516. Further, the exciter inverter 510 is coupled to a power source 511. The exciter inverter 510 is configured to convert power input by the power source 511 and provide an AC power/current to the field winding 512.

Further, a plurality of sensors is employed along with the multiphase electrical machine 502. These sensors are configured to facilitate measurement of various parameters. The sensors may include an angle sensor 518 and a torque sensor 520. The angle sensor 518 is configured to determine an angle, such as a rotational angle of the crankshaft. Moreover, the torque sensor 520 is configured to determine the torque of the aircraft engine. In one embodiment, the torque sensor 520 provides a measure of a drag torque experienced by the aircraft engine. As noted hereinabove, the term "drag torque," is a frictional torque required to overcome internal friction to rotate a fan of the aircraft engine. The rotational angle of the crankshaft and the torque of the aircraft engine may be employed to determine the magnitude, frequency, and phase of a current to be provided to the three-phase stator windings 508 by the converters 504, 506. The rotational angle of the crankshaft and the torque of the aircraft engine may also be employed to determine the magnitude, frequency, and phase of a current to be provided to the field winding 512 from the exciter inverter 510.

It is desirable to provide a desirable/determined value of torque to the aircraft engine to start the aircraft engine, where the desirable/determined torque value is greater than the drag torque value of the aircraft engine. Accordingly, values of the magnitudes, frequencies, and phases of currents provided to the three-phase stator windings 508 and the field winding 512 are determined to enable the multiphase electrical machine 502 to generate mechanical power/torque having the desirable/determined value. As will be appreciated, the value of mechanical power/torque generated by any electrical machine is dependent on the magnitude, frequency, and phase of an electrical parameter provided to the stator and field windings of that electrical machine. In accordance with aspects of the present specification, the value of mechanical power/torque supplied from the multiphase electrical machine 502 to the aircraft engine is greater than the value of drag torque of the aircraft engine over a determined period of time to enable the crankshaft to attain a desired speed level to start the aircraft engine. In this scenario, the multiphase electrical machine 502 operates as a motor.

Once the aircraft engine is started, the multiphase electrical machine 502 is configured to cease supply of any additional mechanical power/torque to the aircraft engine. Accordingly, when the supply of additional power/torque to the aircraft engine is stopped, the multiphase electrical machine 502 is configured to commence operating as a generator. In this mode of operation as a generator, the multiphase electrical machine 502 is configured to supply electrical power to loads. Additionally, the input mechanical power/torque required by the multiphase electrical machine 502 to operate as a generator is provided by the powered aircraft engine.

Even when the multiphase electrical machine 502 operates as a generator, the exciter inverter 510 continues to provide a determined value of the current to the field winding 512 of the multiphase electrical machine 502. The current provided by the exciter inverter 510 to the field winding 512 aids in controlling a magnitude of voltage/electrical power generated by the multiphase electrical machine 502 when operating as a generator.

Figure 6A:
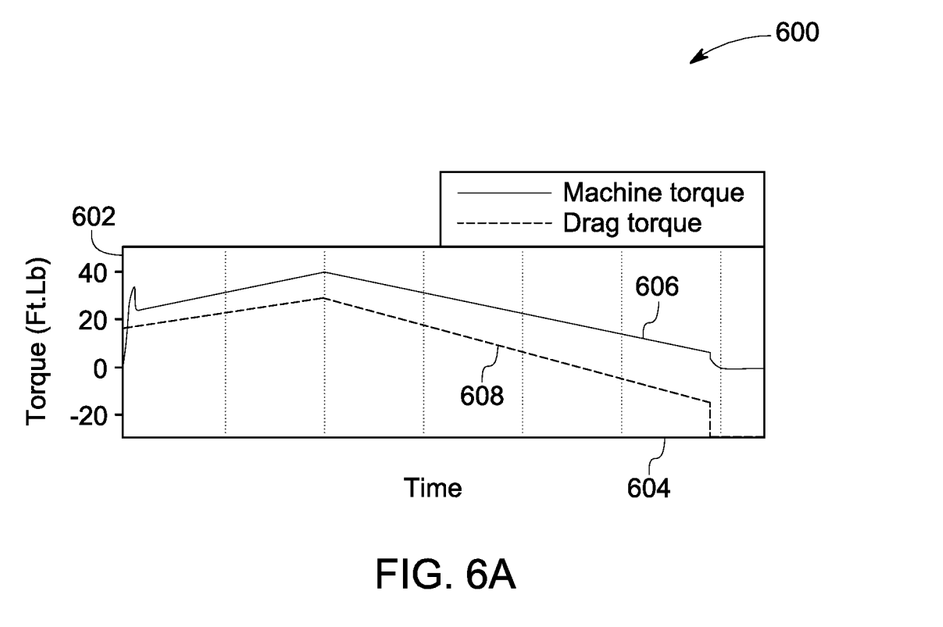
FIG. 6(a) is a diagrammatical representation of torque characteristics of the multiphase electrical machine of FIG. 5, according to aspects of the present specification.

FIG. 6(*a*) is a diagrammatical representation 600 of torque characteristics of a multiphase electrical machine such as the first multiphase electrical machine 308 of FIG. 3 for use in the electrical power unit 104 of FIG. 1, according to aspects of the present specification. Reference numeral 602 depicts a y-axis indicating torque in foot/pound. Reference numeral 604 depicts an x-axis indicating time in seconds. Curve 606 is indicative of a machine torque over a period of time. The term "machine torque," as used herein, refers to the torque provided by the multiphase electrical machine to the engine via a crankshaft. Also, curve 608 is indicative of a drag torque over a period of time. In the example of FIG. 6(*a*), the machine torque 606 is greater than the drag torque 608 over the period of time, thereby facilitating starting of an aircraft engine.

Figure 6B:
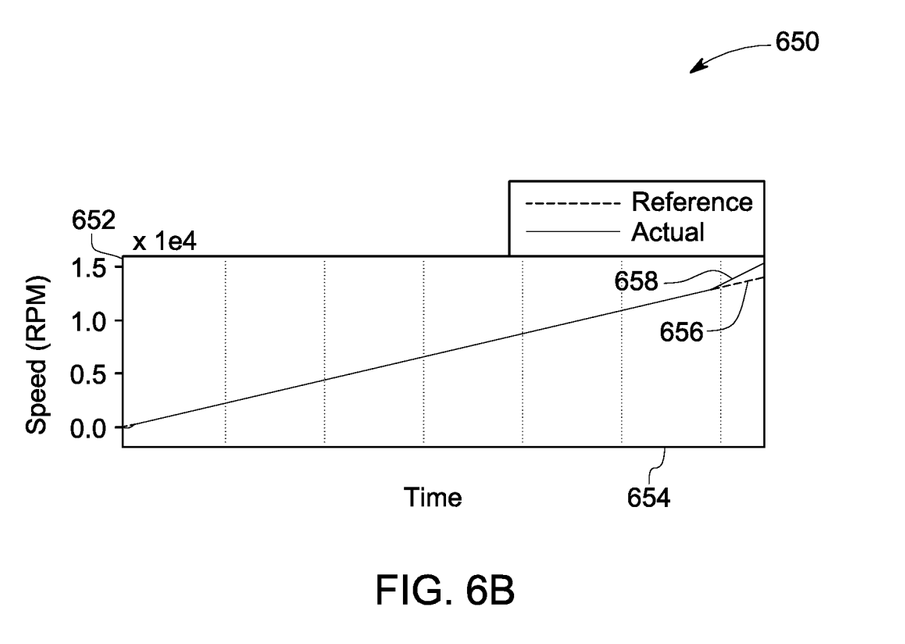
FIG. 6(b) is a diagrammatical representation of speed characteristics of an engine coupled to the electrical power unit of FIG. 1, according to aspects of the present specification.

Turning now to FIG. 6(*b*), a diagrammatical representation 650 of speed characteristics of an engine coupled to the electrical power unit 104 of FIG. 1, according to aspects of the present specification, is presented. Reference numeral 652 depicts a y-axis indicating speed in rpm. Reference numeral 654 depicts an x-axis indicating time in seconds. Curve 656 is indicative of a reference speed over a period of time. The term "reference speed," as used herein, refers to a desired speed profile for starting the aircraft engine. The desired speed profile is determined based on various parameters such as weather conditions, operational capability of motors, and the like.

Curve 658 is indicative of an actual speed of the engine, such as the engine 302 of FIG. 3 over a period of time. As represented in FIG. 6(*b*), the actual speed curve 658 follows the reference speed curve 656 at all instances in time. Once, the actual speed curve 658 reaches a threshold speed level required for starting the aircraft engine, the aircraft engine is started. Alternatively, when a machine torque is greater than the drag torque over a period of time, the crankshaft attains a speed level required for starting the aircraft engine.

Figure 7:
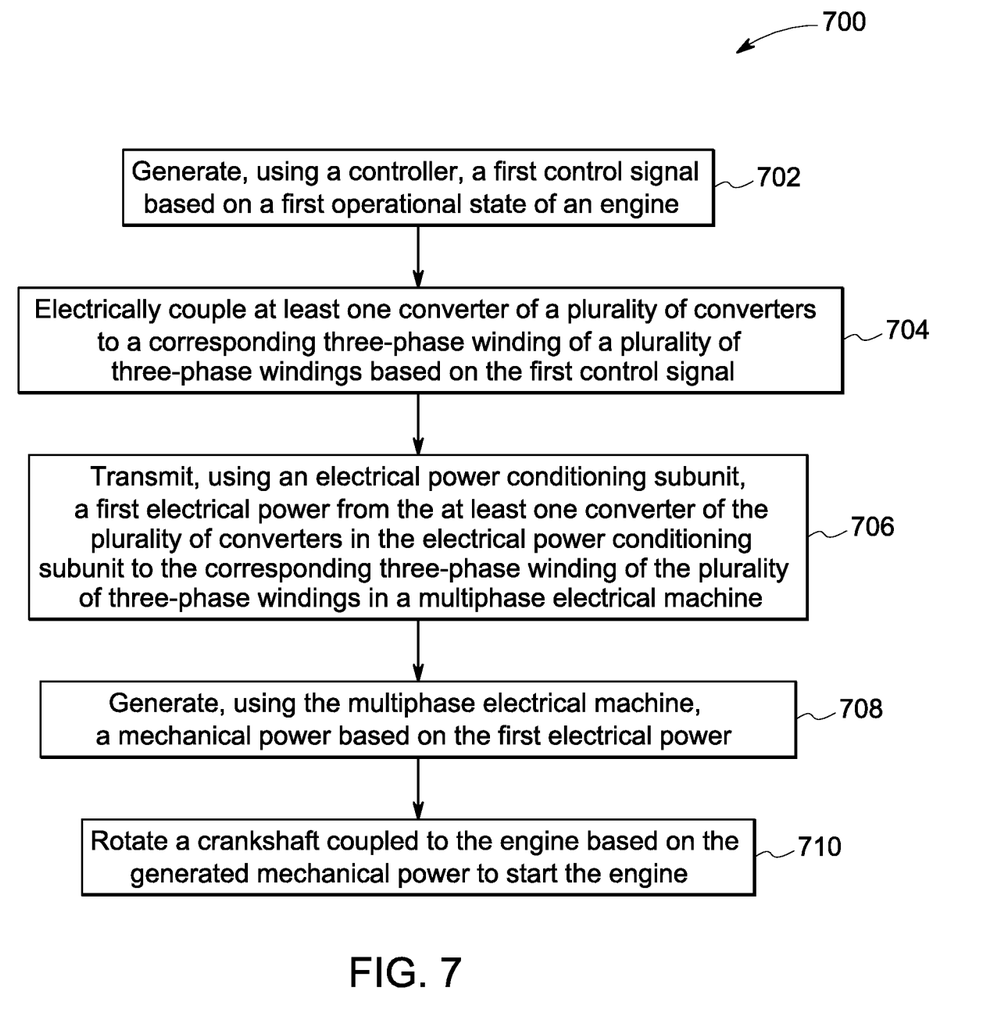
FIG. 7 is a flow chart representing a method for operating the electrical power unit of FIG. 1, according to aspects of the present specification.

FIG. 7 is a flow chart representing a method for operating the electrical power unit 104 of FIG. 1, according to aspects of the present specification. The method of FIG. 7 is described with respect to components of FIG. 3.

The method begins at block 702, where the controller 322 generates a first control signal based on a first operational state of the engine 302. The first operational state includes an idle state of the engine 302 before the engine 302 is started. Particularly, the controller 322 is configured to generate the first control signal when the engine 302 is in the idle state and has to be started. The first control signal includes a first switching pattern corresponding to the switches of the electrical power conditioning subunit 320.

At block 704, at least one converter 336, 338 of the plurality of converters is electrically coupled to a corresponding three-phase winding 312, 314 of the plurality of three-phase windings based on the first control signal. In certain embodiments, each converter 336, 338 of the plurality of converters is electrically coupled to a corresponding three-phase winding 312, 314 of the plurality of three-phase windings based on the first control signal. The first control signal includes a first switching pattern corresponding to the switches of the electrical power conditioning subunit 320. The switches of the electrical power conditioning subunit 320 are opened/closed according to the first switching pattern to electrically couple each converter of the plurality of converters to a corresponding three-phase winding of the plurality of three-phase windings of the multiphase electrical machine 308. In one example, the first converter 336 is electrically coupled to the first three-phase winding 312 and the second converter 338 is electrically coupled to the second three-phase winding 314 based on switching of switches 342, 344, 346, 348, 350, 352, 354 according to the first switching pattern.

Further, at block 706, subsequent to coupling of at least one converter to the corresponding three-phase winding of the multiphase electrical machine 308, a first electrical power is conveyed from at least one converter to the corresponding three-phase winding of the multiphase electrical machine 308. In particular, an input electrical power provided by an external power supply 356 is supplied to the electrical power conditioning subunit 320. More particularly, the input electrical power is supplied to each of the converters 336, 338. This input electrical power is converted to the first electrical power by the converters 336, 338. In one embodiment, the input electrical power is a DC power. In this embodiment, the DC power is provided to the first and the second converters 336, 338 via the first and second DC buses 332, 334. The first and the second converters 336, 338 convert the DC power into a corresponding three-phase AC power. In particular, the first converter 336 generates a first-three-phase AC power. The first three-phase AC power is provided from the first converter 336 to the first three-phase winding 312. In a similar manner, the second converter 338 generates a second three-phase AC power. The second three-phase AC power is provided from the second converter 338 to the second three-phase winding 314. The first and second three-phase AC power may be referred to as the first electrical power.

Moreover, at block 708, the multiphase electrical machine 308 is configured to generate a mechanical power based on the first electrical power. More particularly, the first multiphase electrical machine 308 is configured to generate the mechanical powers based on the first and second three-phase AC powers generated by the first and second converters 336, 338. As previously noted, the mechanical power generated by the first multiphase electrical machine 308 is referred to as an output mechanical power. In this scenario, the first multiphase electrical machine 308 operates as a motor.

Additionally, at step 710, the output mechanical power is supplied to the engine 302 to start the engine 302. Particularly, the output mechanical power generated by the first multiphase electrical machine 308 is provided to a crankshaft 319 that is operatively coupled to the engine 302. The rotations of the crankshaft 319 are used to start the engine 302.

Once the engine 302 is started, the first and second multiphase electrical machines 308, 310 may operate as generators. In this scenario, the powered engine 302 is configured to provide an input mechanical power to the first and second multiphase electrical machines 308, 310 to operate the first and second multiphase electrical machines 308, 310 as generators. Further, the first and second multiphase electrical machines 308, 310 are configured to convert the input mechanical power to a second electrical power.

Additionally, the controller 322 is configured to generate a second control signal. The switches of the electrical power conditioning subunit 320 are opened or closed based on a second switching pattern corresponding to the second control signal. In particular, the multiphase electrical machine 308 is electrically coupled to one load via one converter based on the opening and closing of switches of the electrical power conditioning subunit 320 in accordance with second switching pattern. Subsequent to this electrical coupling, the multiphase electrical machine 308 is configured to convey the second electrical power to the one load via the corresponding converter to activate that load. In a similar manner, the multiphase electrical machine 310 is configured to convey the second electrical power to the other loads via the corresponding converter to activate these other loads.

Furthermore, the foregoing examples, demonstrations, and process steps such as those that may be performed by the system may be implemented by suitable code on a processor-based system, such as a general-purpose or special-purpose computer. It should also be noted that different implementations of the present technique may perform some or all of the steps described herein in different orders or substantially concurrently, that is, in parallel. Furthermore, the functions may be implemented in a variety of programming languages, including but not limited to C++ or Java. Such code may be stored or adapted for storage on one or more tangible, machine readable media, such as on data repository chips, local or remote hard disks, optical disks (that is, CDs or DVDs), memory or other media, which may be accessed by a processor-based system to execute the stored code. Note that the tangible media may comprise paper or another suitable medium upon which the instructions are printed. For instance, the instructions may be electronically captured via optical scanning of the paper or other medium, then compiled, interpreted or otherwise processed in a suitable manner if necessary, and then stored in the data repository or memory.

Various embodiments of an electrical power unit configured to rotate a crankshaft that is coupled to the engine to start the engine and a method for rotating the crankshaft to start the engine using an electrical power unit are presented. The systems and methods presented herein aid in starting the engine using the electrical power unit and providing electrical power to activate loads coupled to the electrical power unit. Further, the use of exemplary electrical power unit circumvents the need for autotransformers, thereby reducing the footprint of electrical power unit. Also, use of the exemplary electrical power unit entails operation of associated electrical machines to their full capacity. The exemplary electrical power unit may be employed in propulsion systems, such as aircrafts and in marine systems. The use of the exemplary electrical power unit in any starter generation system is also envisaged.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof.

The invention claimed is:

1. An electrical power unit, comprising:
a controller configured to generate a first control signal based on a first operational state of an engine;
a multiphase electrical machine comprising a first three-phase winding and a second three-phase winding; and
an electrical power conditioning subunit operatively coupled to the controller, wherein the electrical power conditioning subunit comprises a first converter electrically coupled to the first three-phase winding and a second converter electrically coupled to the second three-phase winding, wherein the first converter is electrically coupled to the first three-phase winding and the second converter is electrically coupled to the second three-phase winding based on the first control signal, and wherein the electrical power conditioning subunit is configured to transmit a first electrical power from the first converter and the second converter to the first three-phase winding and second three-phase winding,
wherein the multiphase electrical machine is configured to:
generate a mechanical power based on the first electrical power, and
rotate a crankshaft operatively coupled to the engine based on the generated mechanical power to start the engine.

2. The electrical power unit of claim 1, wherein the first operational state comprises an idle state of the engine, and wherein a second operational state of the engine comprises a powered state of the engine.

3. The electrical power unit of claim 2, wherein the controller is further configured to generate a second control signal based on the second operational state.

4. The electrical power unit of claim 3, wherein the electrical power unit is further operatively coupled to a plurality of loads.

5. The electrical power unit of claim 4, wherein the multiphase electrical machine is configured to be electrically coupled to a load of the plurality of loads via at least one of the first converter and the second converter based on the second control signal.

6. The electrical power unit of claim 5, wherein the multiphase electrical machine is further configured to provide a second electrical power to the load of the plurality of loads via at least one of the first converter and the second converter to activate the load.

7. The electrical power unit of claim 1, wherein the electrical power conditioning subunit further comprises a plurality of switches, a direct current (DC) bus, an alternating current (AC) bus, a synchronizing line, a plurality of rectifiers, and a plurality of filters.

8. The electrical power unit of claim 7, wherein the plurality of switches comprises at least one of a semiconductor switch, a mechanical relay, a contactor, and a circuit breaker.

9. The electrical power unit of claim 1, wherein the first electric power includes a first three-phase AC power provided from the first converter to the first three-phase winding and a second three-phase AC power provided from the second converter to the second three-phase winding, and wherein the first three-phase AC power and the second three-phase AC power have a phase difference of about 30 degrees.

10. The electrical power unit of claim 7, wherein the synchronizing line is configured to communicatively couple the first converter to the second converter.

11. The electrical power unit of claim 1, wherein the controller is further configured to control operation of the first converter and the second converter based on an operational parameter of the first converter and the second converter.

12. The electrical power unit of claim 1, wherein the engine is an aircraft engine.

13. A method for rotating a crankshaft operatively coupled to an engine to start the engine using an electrical power unit, wherein the electrical power unit comprises a controller, a multiphase electrical machine, and an electrical power conditioning subunit, the method comprising:
  generating, using the controller, a first control signal based on a first operational state of the engine;
  electrically coupling a first converter and a second converter in the electrical power conditioning subunit to a first three-phase winding and a second three-phase winding, respectively, in the multiphase electrical machine based on the first control signal;
  transmitting, using the electrical power conditioning subunit, a first electrical power from the first converter and the second converter in the electrical power conditioning subunit to the first three-phase winding and the second three-phase winding in the multiphase electrical machine;
  generating, using the multiphase electrical machine, a mechanical power based on the first electrical power; and
  rotating a crankshaft operatively coupled to the engine based on the generated mechanical power to start the engine.

14. The method of claim 13, further comprising generating a second control signal based on a second operational state of the engine.

15. The method of claim 14, further comprising electrically coupling the multiphase electrical machine to a load of a plurality of loads via at least one of the first converter and the second converter based on the second control signal.

16. The method of claim 15, further comprising providing a second electrical power to the load of the plurality of loads via at least one of the first converter and the second converter to activate the load.

17. The method of claim 13, wherein the multiphase electrical machine comprises a six-phase electrical machine.

18. The method of claim 17, wherein the first converter comprises a three-phase converter, and wherein the three-phase converter comprises a three-phase output terminal.

19. The method of claim 18, wherein electrically coupling the first converter to the first three-phase winding comprises coupling the three-phase output terminal of the three-phase converter to the first three-phase winding of the six-phase electrical machine.

20. A propulsion system, comprising:
  an engine;
  an electrical power unit coupled to the engine, wherein the electrical power unit comprises:
  a controller configured to generate a first control signal based on a first operational state of the engine;
  a multiphase electrical machine comprising a first three-phase winding and a second three-phase winding; and
  an electrical power conditioning subunit operatively coupled to the controller, wherein the electrical power conditioning subunit comprises a first converter electrically coupled to the first three-phase winding and a second converter electrically coupled to the second three-phase winding, wherein the first converter is electrically coupled to the first three-phase winding and the second converter is electrically coupled to the second three-phase winding based on the first control signal, and wherein the electrical power conditioning subunit is configured to transmit a first electrical power from the first converter and the second converter to the first three-phase winding and the second three-phase winding,
  wherein the multiphase electrical machine is configured to:
  generate mechanical power based on the first electrical power, and
  rotate a crankshaft operatively coupled to the engine based on the generated mechanical power to start the engine.

21. The propulsion system of claim 20, wherein the propulsion system is an aircraft.

* * * * *